(12) United States Patent
Chen

(10) Patent No.: US 11,228,177 B2
(45) Date of Patent: Jan. 18, 2022

(54) POWER CONTROL SYSTEM

(71) Applicant: Ming-Tsung Chen, Taipei (TW)

(72) Inventor: Ming-Tsung Chen, Taipei (TW)

(*) Notice: Subject to any disclaimer, the term of this patent is extended or adjusted under 35 U.S.C. 154(b) by 118 days.

(21) Appl. No.: 16/824,847

(22) Filed: Mar. 20, 2020

(65) Prior Publication Data

US 2021/0296901 A1 Sep. 23, 2021

(51) Int. Cl.
*H02J 3/32* (2006.01)
*H02J 13/00* (2006.01)
*G05B 13/02* (2006.01)
*G01R 21/133* (2006.01)
*H02J 3/38* (2006.01)

(52) U.S. Cl.
CPC ............. *H02J 3/32* (2013.01); *G01R 21/133* (2013.01); *G05B 13/026* (2013.01); *H02J 3/381* (2013.01); *H02J 13/00002* (2020.01); *H02J 13/00006* (2020.01); *H02J 2300/22* (2020.01)

(58) Field of Classification Search
CPC .. H02J 3/32; H02J 13/00002; H02J 13/00006; H02J 3/381; H02J 2300/22; G05B 13/026; G01R 21/133
See application file for complete search history.

(56) References Cited

U.S. PATENT DOCUMENTS

| | | | |
|---|---|---|---|
| 2011/0133655 A1* | 6/2011 | Recker ................. | H05B 47/16 315/159 |
| 2012/0116597 A1* | 5/2012 | Bultman ............... | G01D 4/002 700/286 |
| 2012/0173035 A1* | 7/2012 | Abe .................... | H02M 5/4505 700/297 |
| 2012/0181974 A1* | 7/2012 | Kuniyosi .............. | H02J 3/383 320/101 |
| 2014/0039699 A1* | 2/2014 | Forbes, Jr. ............ | G05B 13/02 700/286 |
| 2014/0114829 A1* | 4/2014 | Forbes, Jr. ............ | B60L 53/68 705/35 |

* cited by examiner

*Primary Examiner* — Ziaul Karim
(74) *Attorney, Agent, or Firm* — Li & Cai Intellectual Property (USA) Office

(57) ABSTRACT

A power control system is disposed in a predetermined area. The power control system includes a server, a smart gateway device, a power detection device, a smart meter, a first power control device, a power generation device, a second power control device, a plurality of electronic devices, and a power storage device. The power detection device detects a value of a supply current per second of the first power of the first power control device. The power detection device detects a value of a used current per second of the second power of the second power control device. The power detection device provides a current difference between the value of the supply current and the value of the used current to the first power control device and the smart gateway device. The first power control device adjusts the first power at least based on the current difference.

7 Claims, 6 Drawing Sheets

POWER CONTROL SYSTEM

FIELD OF THE DISCLOSURE

The present disclosure relates to a power control system, and more particularly to a power control system that controls electrical power in real time.

BACKGROUND OF THE DISCLOSURE

Although private-owned electrical power is gradually increasing in output, an electrical grid system is still required to provide a large amount of electrical power. In this case, it is necessary to reduce the load on the electrical grid system and improve the utilization rate of private-owned electrical power through a design of a power control system.

Therefore, it is an important subject in the industry to provide a power control system that controls electrical power in real time.

SUMMARY OF THE DISCLOSURE

In response to the above-referenced technical inadequacies, the present disclosure provides a power control system. The power control system is disposed in a predetermined area. The power control system is electrically connected to an electrical grid system. The power control system includes a server, a smart gateway device, a power detection device, a smart meter, a first power control device, a power generation device, a second power control device, a plurality of electronic devices, and a power storage device. The smart gateway device is in communication with the server. The power detection device is in communication with the smart gateway device. The first power control device is electrically connected to the smart meter. The first power control device provides a first power. The power generation device is electrically connected to the first power control device. The second power control device is electrically connected to the smart meter. The second power control device receives a second power. The plurality of electronic devices is electrically connected to the second power control device. The power storage device is electrically connected to the second power control device. The power detection device detects a value of a supply current per second of the first power of the first power control device. The power detection device detects a value of a used current per second of the second power of the second power control device. The power detection device provides a current difference of the value of the supply current and the value of the used current to the first power control device and the smart gateway device. The first power control device adjusts the first power at least based on the current difference.

Therefore, the power control system of the present application uses the power detection device, the smart gateway device, and the server that have a real-time calculation function to jointly provide a system capable of providing a long-interval power prediction and a real-time power prediction. The power control system further includes a first power control device and a second power control device to effectively control a power supply in a predetermined area for self-sufficiency, while reducing the load of the electrical grid system.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
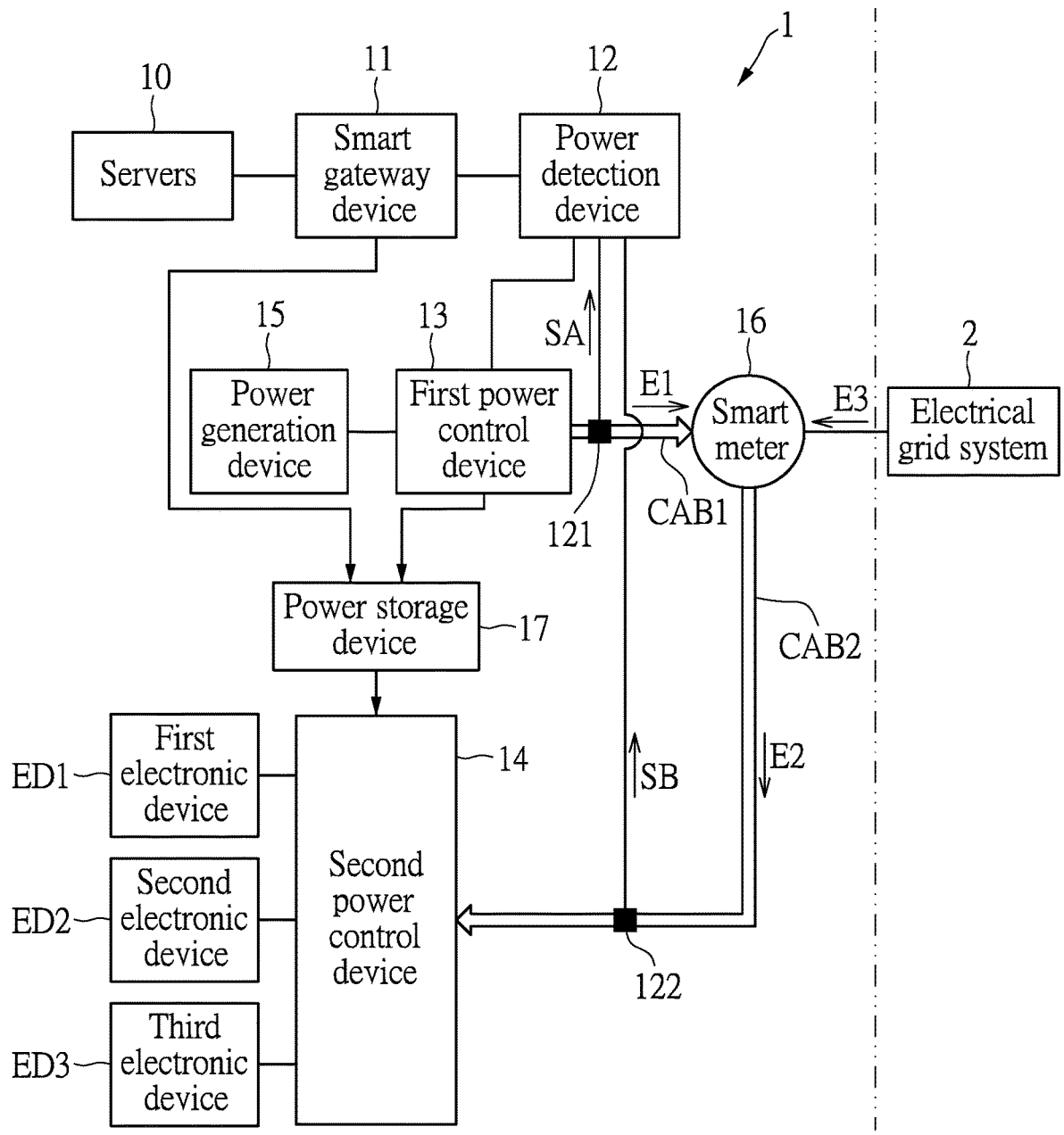
FIG. 1 is a functional block diagram of a power control system according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, FIG. 1 is a schematic view of a power control system according to an embodiment of the present application.

A power control system 1 is disposed in a predetermined area (not shown). The power control system 1 is electrically connected to an electrical grid system 2. The predetermined area (not shown) can be a house, a company, a building, or a manor, but it is not limited thereto in the present disclosure. At least a power generation device is disposed in the predetermined area (not shown) to supply power for the plurality of electronic devices in the predetermined area (not shown). In addition, the electrical grid system 2 can also provide power to the electronic devices in the predetermined area (not shown).

The power control system 1 includes a server 10, a smart gateway device 11, a power detection device 12, a first power control device 13, a second power control device 14, a power generation device 15, a smart meter 16, and a power storage device 17.

The smart gateway device 11 is in communication with the server 10 in a wired manner or in a wireless manner. The power detection device 12 is also in communication with the smart gateway device 11 in a wired manner or in a wireless manner. In the embodiment, the server 10 is a local server or a remote server.

The first power control device 13 is electrically connected to the smart meter 16. The power generation device 15 is electrically connected to the first power control device 13 for generating an electrical power. The electrical power of the power generation device 15 is provided to the first power control device 13. The first power control device 13 provides a first power to the smart meter 16.

The second power control device 14 is also electrically connected to the smart meter 16 for receiving a second power. A plurality of electronic devices ED1-ED3 is electrically connected to the second power control device 14. In the embodiment, a first electronic device ED1, a second electronic device ED2, and a third electronic device ED3 are electrically connected to the second power control device 14. The first electronic device ED1, the second electronic device ED2 and the third electronic device ED3 can be a television, a washing machine, an electric heater, an air conditioner, an illumination device, an electric water heater or a charging device, but it is not limited thereto in the present application.

In other words, the second power control device 14 is configured for adjusting the power generated in the predetermined area (not shown) of the power control system 1. The second power control device is configured to connect to the plurality of electronic devices and adjusting a used power of the plurality of electronic devices. In the embodiment, the first power control device 13 is electrically connected to the smart meter 16 by a first power cable CAB1. The second power control device 14 is electrically connected to the smart meter 16 by a second power cable CAB2.

In the embodiment, the power storage device 17 is electrically connected to the first power control device 13 and the second power control device 14.

Figure 2:
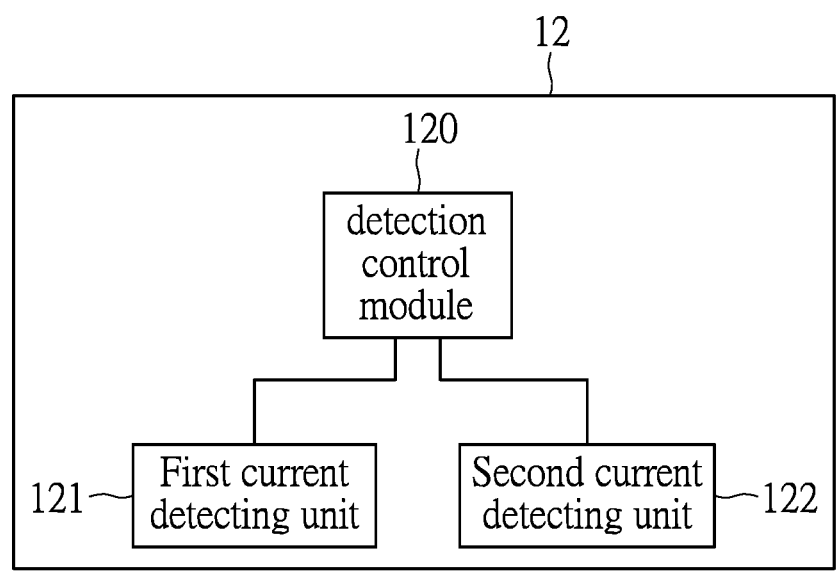
FIG. 2 is a functional block diagram of a power detection device of the present application.
Figure 3:
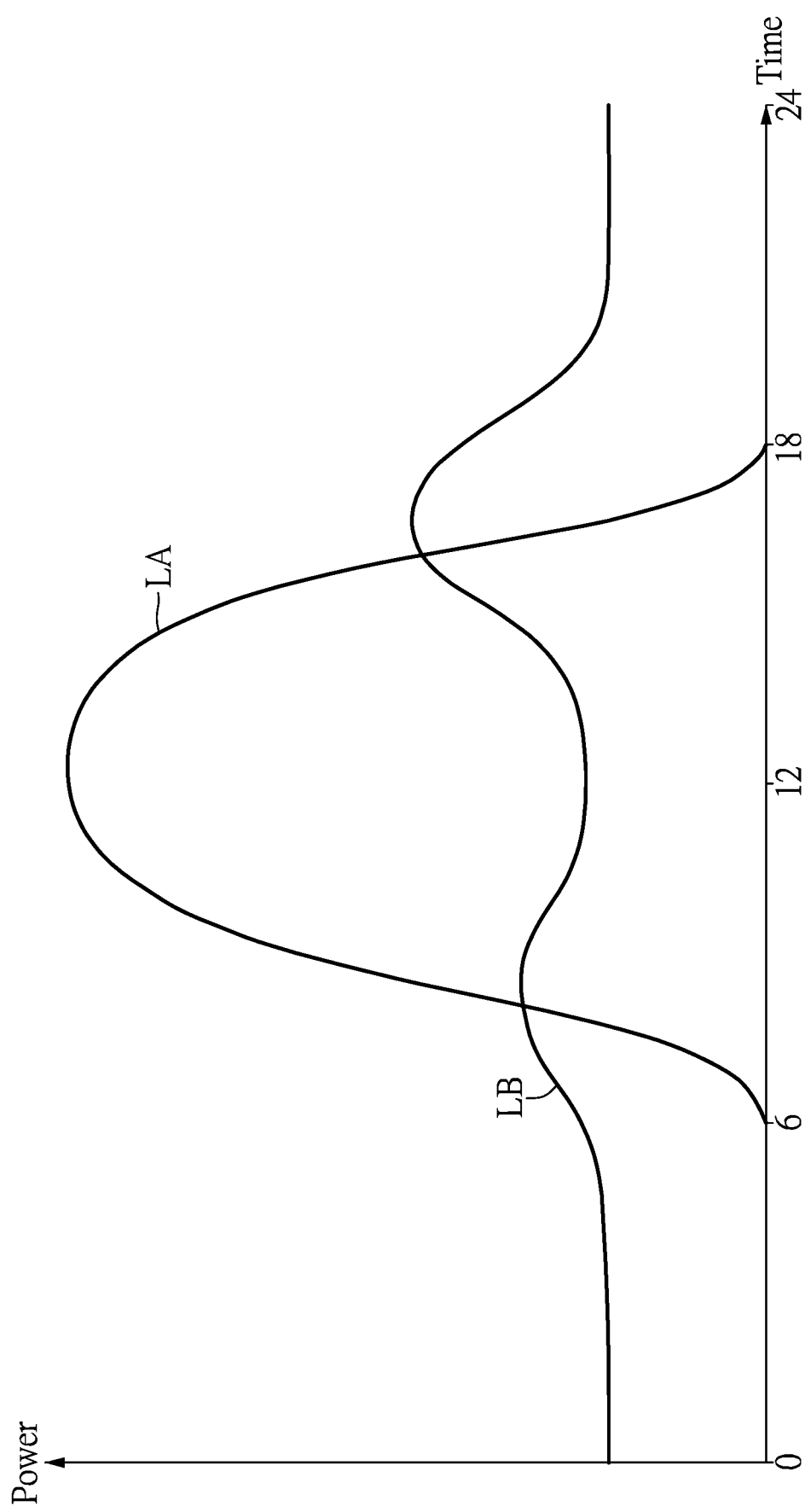
FIG. 3 is a curve diagram of a first power and a second power of the power control system of the present application.

Referring to FIG. 2, FIG. 2 is a schematic view of a power detection device of the present application.

The power detection device 12 includes a detection control module 120, a first current detecting module 121, and a second current detecting module 122. The detection control module 120 is electrically connected to the first current detecting module 121 and the second current detecting module 122. The first current detecting module 121 and the second current detecting module 122 are respectively disposed on the exterior of the first power cable CAB1 and the second power cable CAB2 for detecting a value of a supply current SA of the first power and a value of a used current SB of the second power. The first current detecting module 121 and the second current detecting module 122 are disposed on the first power cable CAB1 and the second power cable CAB2. The first current detecting module 121 and the second current detecting module 122 can each be an induction ammeter or a Hall sensor. The detection control module 120 is a central processing unit (CPU) or a microcontroller (MCU).

The power detection device 12 uses the first current detecting module 121 to detect the value of the supply current SA per second of the first power E1 of the first power control device 13 supplied to the smart meter 16. In other words, the power detection device 12, using the first current detecting module 121, records current values of the first power E1 per second.

The power detection device 12 uses the second current detecting module 122 to detect the value of the used current SB per second of the second power E2 of the second power control device 14, and the second power E2 is received from the smart meter 16. In other words, the power detection device 12, using the second current detecting module 122, records current values of the second power E2 per second. In the embodiment, since the voltage values of the predetermined area (not shown) are identical, only the current values are recorded. In the other embodiments, when there are different voltage values and multiple smart meters disposed in the predetermined area (not shown), the voltage values and the current values are both recorded simultaneously.

Furthermore, the detection control module 120 of the power detection device 12 provides a current difference D between the value of the supply current SA per second and the value of the used current SB per second to the first power control device 13 and the smart gateway device 11. In addition, the power detection device 12 also transmits the value of the supply current SA and the value of the used current SB per second to the smart gateway device 11.

The first power control device 13 adjusts the first power E1 provided to the power generation device 15 at least based on the current difference D provided by the first power control device 13 so that the second power E2 is greater than or equal to the first power E1.

When the first power E1 is greater than the second power E2, the first power control device 13 firstly blocks the power path connected to the smart meter 16, and the first power E1 generated by the power generation device 15 is stored in the power storage device 17. In other words, the power control system 1 monitors the first power E1 and the second power E2 per second, so that the first power E1 generated in the power control system 1 is not provided to the electrical grid system 2.

When the first power E1 is less than the second power E2, the power control system 1 purchases a third power E3 provided by the electrical grid system 2 through the smart meter 16. In the embodiment, the power control system 1 controls the third power E3 of the predetermined area (not shown), so that the third power E3 is greater than or equal to zero.

The smart gateway device 11 receives the value of the supply current SA, the value of the used current SB, and the corresponding current difference D recorded by the power detection device 12. The smart gateway device 11 provides a predicted current value per minute of the supply current SA and a predicted current value per minute of the used current SB to the power detection device 12 per minute.

A predicted value per minute of the supply current and a predicted value per minute of the used current are predicted variation of the value of the supply current SA and predicted variation of the used current SB within one minute. In other words, the smart gateway device 11 performs calculations based on the sixty supply current values SA and sixty used current values SB in one minute to obtain a trend in variation of the supply current value SA and the used current values SB in the next minute. In other words, the power detection device 12 provides a power control signal to the first power control device 13 based on the value of the supply current SA, the value of the used current SB, the current difference D, the predicted value per minute of the supply current, and the predicted value per minute of the used current to adjust the first power.

Furthermore, the smart gateway device 11 also transmits the values of the supply current SA recorded per second, the values of the used current SB recorded per second, the current difference D recorded per second, the predicted values per minute of the supply current, and the predicted values per minute of the used current to the server 10.

The server 10 calculates a predicted value per hour of the supply current and a predicted value per hour of the used current at least based on the value of the supply current SA, the value of the used current SB, the current difference D, the predicted value per minute of the supply current, and the predicted value of per minute of the used current. In addition, the server 10 also calculates the predicted value per hour of the supply current and the predicted value per hour of the used current based on the weather forecast, the terrain, historical weather records, and parameters such as temperature, humidity, and brightness from an environmental sensor 101 disposed near the predetermined area (not shown).

The server 10 transmits the predicted value per hour of the supply current and the predicted value per hour of the used current to the smart gateway device 11, so that the smart gateway device 11 can calculate the predicted value per second of the supply current and the predicted value per second of the used current based on the predicted value per hour of the supply current, the predicted value per hour of the used current, the predicted value per minute of the supply current SA, the predicted value per minute of the used current SB, the value of the supply current SA, the value of the used current SB, and the current difference D.

In the embodiment, the power generation device 15 is a solar power generation device. The power storage device 17 can be a lithium ion battery, a nickel-manganese battery, a lithium polymer battery, or a lithium-manganese dioxide battery. In the embodiment, the second power control device 14 includes an AC to DC voltage converter and an AC to AC voltage converter.

In addition, the smart gateway device 11 can also directly provide a power storage control signal to the power storage device 17 to turn on the power storage device 17, or turn off the power storage device 17 to provide the power to the second first power control device 14. In other words, the power can be stored in the power storage device 17 by the second power control device 14. The power of the power storage device 17 can be provided to the first electronic device ED1, the second electronic device ED2, and the third electronic device ED3.

Figure 4:
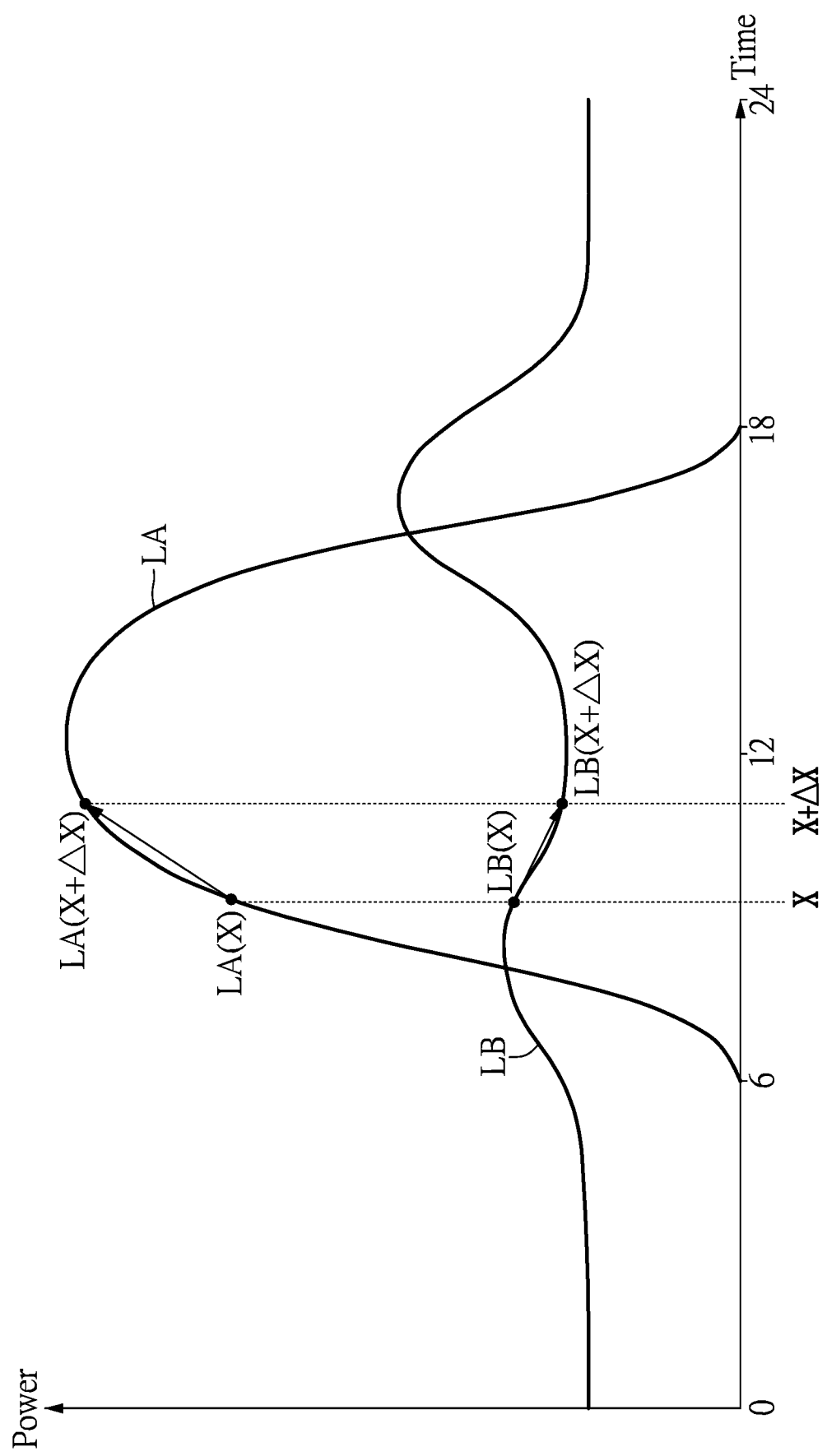
FIG. 4 is a curve diagram showing that the values of a supply current and a used current of the power control system of the present disclosure are determined based on the values of the supply current and the value of the used current.

Referring to FIG. 4, FIG. 4 is a schematic view of the power detection device of the power control system of the present application, calculating the predicted values of the supply current and the used current.

The first curve LA is a change log of the first power E1. The second curve LB is a change log of the second power E2. After sunrise, the first curve LA gradually rises. Before sunrise, the second power E2 in the second curve LB is greater than the first power E1 in the first curve LA. Therefore, the power control system 1 is required to purchase a third power E3 from the electrical grid system 2. During midday, the first power E1 of the first curve LA is greater than the second power E2 of the second curve LB. At this time, the power control system 1 is required to store the power generated by the power generation device 15 in the power storage device 17. Moreover, the power control system 1 is not required to purchase an additional third power E3 from the electrical grid system 2. In other words, the third power E3 at this time is 0. After sunset, the first power E1 of the first curve LA is less than the second power E2 of the second curve LB. At this time, the power control system 1 can provide the power of the power storage device 17 to the plurality of electronic devices ED1-ED3 connected to the second power control device 14. The power control system 1 can also purchase the third power E3 from the electrical grid system 2 for the plurality of electronic devices ED1-ED3.

In FIG. 4, the supply current value LA (X) of the first curve LA and the used current value LB (X) of the second curve LB respectively corresponds to the first time X, while the power detection device 12 can calculate a predicted value of the supply current LA(X+AX) of the second time X+AX, and a predicted value of the used current LB(X+AX) of the second time X+AX based on the supply current value LA (X) and the used current value LB (X). In the embodiment, each of the value of the supply current and each of the value of the used current at each time are calculated based on the predicted value per minute of the supply current, the predicted value per minute of the used current, the predicted value per hour of the supply current, and the predicted value per hour of the used current. The power control system 1 can also be calibrated, based on the actual supply current values and the actual used current values, every predetermined time interval. For example, the power control system 1 can be calibrated every thirty minutes.

In the embodiment, the server 10 not only provides the predicted current value for each hour in a day, but also provides the predicted current value for the next day.

Figure 5:
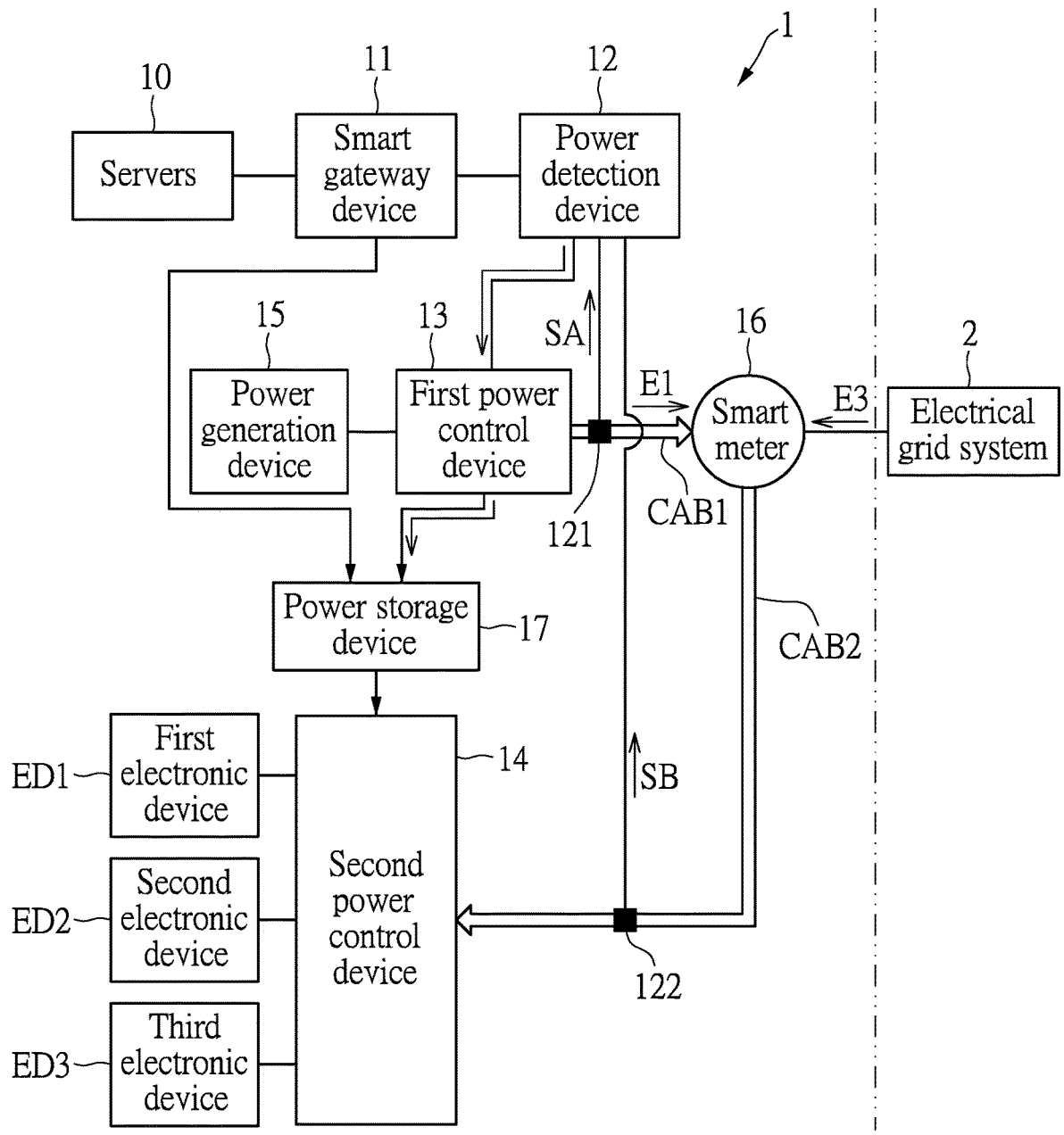
FIG. 5 is a functional block diagram of the power control system of the present application in operation when a first power is greater than a second power.
Figure 6:
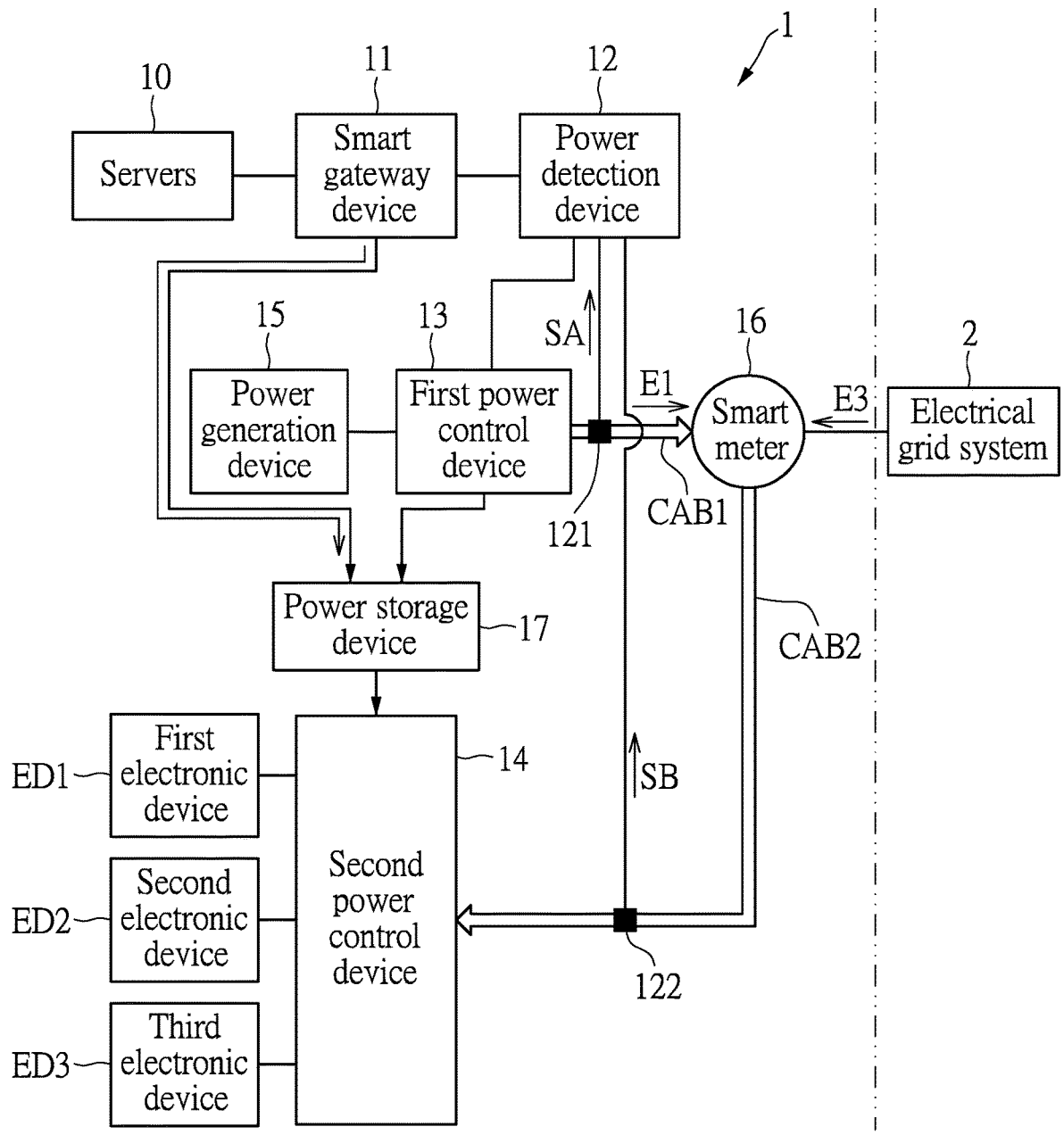
FIG. 6 is another functional block diagram of the power control system of the present application in operation when the first power is greater than the second power.

Referring to FIG. 5 and FIG. 6, FIG. 5 is a schematic view of the power control system of the present application when a first power is greater than a second power. FIG. 6 is another schematic view of the power control system of the present application when a first power is greater than a second power.

In FIG. 5, when the power detection device 12 detects that the first power E1 is greater than the second power E2, the power detection device 12 transmits a control signal to the first power control device 13. The first power control device 13 then stores the power generated by the power generation device 15 in the power storage device 17.

In FIG. 6, the smart gateway device 11 transmits a power storage control signal to the power storage device 17 to directly store the first power E1 in the power storage device 17. At this time, the first power E1 is not provided to the electrical grid system 2. The first power E1 can be stored in the power storage device 17 through the second power control device 14.

In conclusion, the power control system of the present application uses the power detection device, the smart gateway device, and the server that have a real-time calculation function to jointly provide a system capable of providing a long-interval power prediction and a real-time power prediction. The power control system further includes a first power control device and a second power control device to effectively control a power supply in a predetermined area for self-sufficiency, while reducing the load of the electrical grid system.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power control system being disposed in a predetermined area, the power control system being electrically connected to an electrical grid system, the power control system comprising:
    a server;
    a smart gateway device being in communication with the server;
    a power detection device being in communication with the smart gateway device;
    a smart meter;
    a first power control device being electrically connected to the smart meter, the first power control device providing a first power;
    a power generation device being electrically connected to the first power control device;
    a second power control device being electrically connected to the smart meter to receive a second power;
    a plurality of electronic devices being electrically connected to the second power control device; and
    a power storage device being electrically connected to the second power control device;
    wherein the power detection device detects a value of a supply current per second of the first power of the first power control device, and the power detection device detects a value of a used current per second of the second power of the second power control device;
    wherein the power detection device provides a current difference of a value of the supply current and a value of the used current to the first power control device and the smart gateway device, and the first power control device adjusts the first power at least based on the current difference.

2. The power control system of claim 1, wherein the smart gateway device receives the value of the supply current, the value of the used current, the current difference, the smart gateway device providing a predicted value per minute of the supply current, and a predicted value per minute of the used current to the power detection device in one minute, the predicted value per minute of the supply current and the predicted value per minute of the used current being predicted variations of the supply current and the used current in one minute, and wherein the power detection device provides a control signal to the first power control device based on the value of the supply current, the value of the used current, the current difference, the predicted value per minute of the supply current, and the predicted value per minute of the used current.

3. The power control system of claim 2, wherein the smart gateway device transmits the value of the supply current, the value of the used current, the current difference, the predicted value per minute of the supply current, and the predicted value per minute of the used current to the server.

4. The power control system of claim 3, wherein the server calculates a predicted value per hour of the supply current and a predicted value per hour of the used current based on the value of the supply current, the value of the used current, the current difference, a predicted value per minute of the supply current, and a predicted value per minute of the used current.

5. The power control system of claim 1, wherein the power generation device is a solar power generation device.

6. The power control system of claim 1, wherein the second power control device receives a third power of the electrical grid system through the smart meter.

7. The power control system of claim 1, wherein the smart gateway device provides a power storage control signal to the power storage device to turn on or off the power storage device so that the power storage device receives power provided by the second power control device or provides power to the second power control device.

* * * * *